United States Patent [19]
Flannagan et al.

[11] Patent Number: 5,256,917
[45] Date of Patent: Oct. 26, 1993

[54] ECL LOGIC GATE WITH VOLTAGE PROTECTION

[75] Inventors: Stephen T. Flannagan; John D. Porter, both of Austin, Tex.

[73] Assignee: Motorola, Inc., Schaumburg, Ill.

[21] Appl. No.: 863,623

[22] Filed: Apr. 3, 1992

[51] Int. Cl.$^5$ ............... H03K 19/003; H03K 19/086; H03K 19/0175
[52] U.S. Cl. ................... 307/455; 307/362; 307/475
[58] Field of Search ............... 307/355, 362, 475, 354, 307/455, 451, 491, 494, 296.4; 361/88, 90, 86, 91

[56] References Cited

U.S. PATENT DOCUMENTS

| | | | |
|---|---|---|---|
| 4,864,166 | 9/1989 | Gloaguen | 307/455 |
| 4,967,106 | 10/1990 | Tamegaya | 307/455 |
| 5,162,677 | 11/1992 | Takahashi | 307/455 |

OTHER PUBLICATIONS

Burnett and Hu, "Hot-Carrier Degradation in Bipolar Transistors at 300 and 110k-Effect on BiCMOS Inverter Performance", IEEE Trans. on Elec. Dev., vol. 37, No. 4, Apr. '1990, pp. 1171-1173.

Blood, "MECL System Design Handbook", 4th Ed., 1988, FIG. 1-1a, p. 1.

*Primary Examiner*—John Zazworsky
*Attorney, Agent, or Firm*—Daniel D. Hill

[57] ABSTRACT

An ECL logic gate (70) includes a voltage protection clamp (60) for protecting a first bipolar transistor (58) from being too heavily reverse biased when an input signal $A_{IN}$ is pulled to $V_{SS}$. The ECL logic gate (70) includes an emitter-follower input stage and a differential amplifier stage. A voltage protection clamp (60) includes a second transistor (52) and a resistor (53) and acts to divide the amount of reverse bias on the first bipolar transistor (58) between a third transistor (51) and the first transistor (58), thereby bringing the reverse bias voltage on the first transistor (58) within acceptable levels to prevent degradation of the first transistor (58).

20 Claims, 2 Drawing Sheets

ECL LOGIC GATE WITH VOLTAGE PROTECTION

FIELD OF THE INVENTION

This invention relates generally to logic circuits, and more particularly, to bipolar logic circuits having ECL-level input signals.

BACKGROUND OF THE INVENTION

ECL (emitter-coupled logic) is a type of integrated circuit logic which uses bipolar transistors. CMOS is another type of integrated circuit logic, however CMOS uses complementary MOSFET transistors. ECL circuits have the advantage of high speed, but they consume a large amount of power. CMOS logic circuits have the advantages of low power dissipation, high input resistance, low output resistance, and low noise generation. Combining ECL and CMOS on an integrated circuit therefore provides the important advantages of high speed and low power consumption. ECL is used in those circuit portions requiring higher processing speeds. CMOS is used to reduce power consumption in those circuit portions that are less time-critical.

ECL has short switching times because the swing between high and low logic states is only about one volt. ECL signal levels, referenced to a power supply voltage terminal commonly labeled $V_{DD}$, are approximately $V_{DD}$ minus $V_{BE}$ for a logic high voltage, and $V_{DD}$ minus $2V_{BE}$ for a logic low voltage, where $V_{BE}$ is the forward biased base-emitter diode voltage drop of a corresponding bipolar transistor. In contrast, CMOS logic states may swing the full rail of the power supply voltage, or approximately 5 volts. When CMOS levels are applied to a base of a bipolar transistor in an ECL logic circuit, reliability problems can result because of the differences in logic levels. A large reverse bias occurs if a CMOS logic low voltage (about $V_{SS}$) is applied to the base of an input bipolar transistor while the emitter is held at or near $V_{DD}$.

When a large reverse bias is applied across the base-emitter junction of a bipolar transistor, degradation of the transistor occurs. Over time, the constant application of this large reverse bias may cause the input bipolar transistor to fail, resulting in a failure of the entire integrated circuit. Electronically, a large reverse bias on a PN junction causes hot carrier injection into the overlying oxide, resulting in poor junction performance. See, for example, "Hot-Carrier Degradation in Bipolar Transistors at 300 and 110K—Effect on BiCMOS Inverter Performance", by Burnett and Hu in *IEEE Transactions on Electron Devices*, vol. 37, no. 4, April 1990, pp. 1171-1173. The amount of hot carrier injection is proportional to the duration of the reverse bias. The voltage differential of the reverse bias is related to the mean life of the transistor, for given worst case conditions, by an inverse semilogarithmic relationship. Thus, under worst case conditions, the reverse bias decreases linearly as the mean life increases exponentially.

Bipolar transistors can be manufactured using different process technologies. One type of process technology produces diffused junction bipolar transistors, whereas a newer type of process technology produces polysilicon-emitter bipolar transistors. Polysilicon transistors are smaller and have faster switching times than corresponding diffusion bipolar transistors having approximately the same beta ($\beta$). Diffused junction transistors have relatively light doping and large base-emitter junctions, while polysilicon transistors are heavily doped with smaller base-emitter junctions. As doping densities increase, the width of the junction decreases. An electric field is created at the base-emitter junction when the transistor is reverse biased. The electric field is equal to the voltage across the junction divided by the width of the junction. Accordingly, it follows that the smaller the width of the junction, the larger the electric field for a given junction voltage. Therefore, a diffusion bipolar transistor with its relatively wide base-emitter junction can withstand a larger reverse bias, without suffering degradation, than a corresponding polysilicon bipolar transistor with a narrow base-emitter junction.

SUMMARY OF THE INVENTION

Accordingly, there is provided, in one form, an ECL logic gate with voltage protection which includes an input stage, a differential amplifier stage, and voltage protection means. The input stage includes a first emitter-follower bipolar transistor having a base for receiving an input signal, and an emitter for providing a first signal. The differential amplifier stage includes second and third bipolar transistors. The second and third transistors have bases for respectively receiving the first signal and a reference voltage. The emitters of the second and third transistors are coupled together, and their collectors respectively providing second and third signals. The voltage protection means is coupled between the emitters of the second and third transistors and the emitter of the first emitter-follower transistor. The voltage protection means provides a voltage at the emitter of the first emitter-follower bipolar transistor which is substantially half of a voltage difference between the input signal and a voltage at the emitters of the second and third bipolar transistors, when the input signal reverse biases the first emitter follower bipolar transistor and the second bipolar transistor.

These and other features and advantages will be more clearly understood from the following detailed description taken in conjunction with the accompanying drawings.

DESCRIPTION OF THE PREFERRED EMBODIMENT

Figure 1:
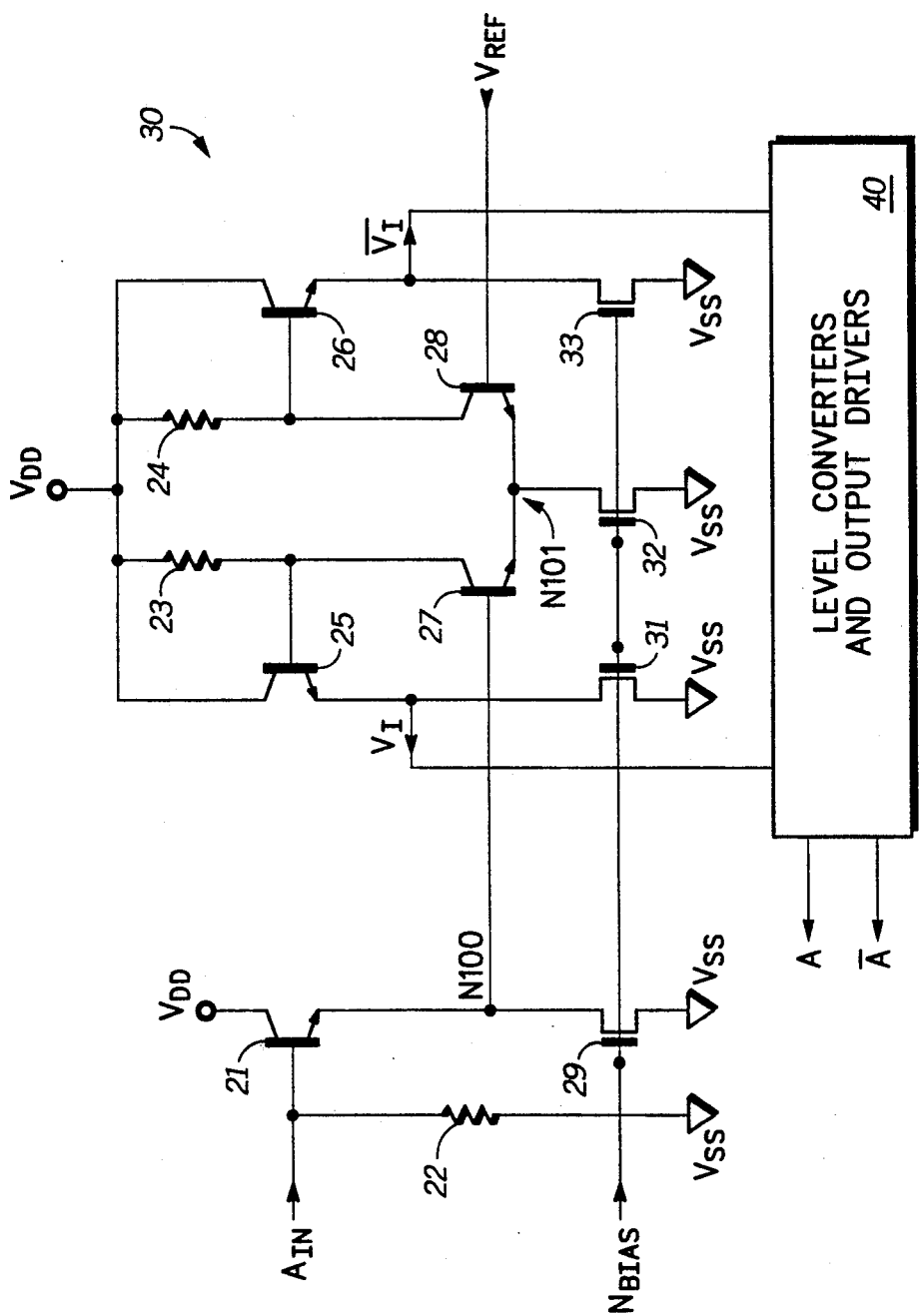
FIG. 1 illustrates in partial schematic form and partial block diagram form a prior art ECL logic gate incorporated in an ECL address buffer.

FIG. 1 illustrates in partial schematic form and partial block diagram form a prior art ECL logic gate 30 incorporated in an ECL address buffer 20. ECL address buffer 20 includes ECL logic gate 30 and level converters and output drivers 40. ECL logic gate 30 includes NPN transistors 21, 25, 26, 27, and 28, N-channel transistors 29, 31, 32, and 33, and resistors 22, 23, and 24. NPN transistor 21 has a collector connected to a positive power supply voltage terminal labeled "$V_{DD}$", a base for receiving an input signal labeled "$A_{IN}$", and an emitter. Resistor 22 has a first terminal connected to the base of transistor 21 and a second terminal connected to a negative power supply voltage terminal labeled "$V_{SS}$". Resistor 23 has a first terminal connected to $V_{DD}$ and a second terminal. NPN transistor 25 has a collector connected to $V_{DD}$, a base connected to the second terminal of resistor 23, and an emitter for providing a signal labeled "$V_I$". NPN transistor 26 has a collector connected to $V_{DD}$, a base connected to the second terminal of resistor 24, and an emitter for providing and a signal labeled "$\overline{V_I}$". NPN transistor 27 has a collector connected to the second terminal of resistor 23, a base connected to the emitter of transistor 21, and an emitter. NPN transistor 28 has a collector connected to the second terminal of resistor 24, a base for receiving a reference voltage labeled "$V_{REF}$", and an emitter connected to the emitter of transistor 27. N-channel transistor 29 has a drain connected to the emitter of transistor 21, a gate for receiving an input voltage labeled "$N_{BIAS}$", and a source connected to $V_{SS}$. N-channel transistor 31 has a drain connected to the emitter of transistor 25, a gate for receiving voltage $N_{BIAS}$, and a source connected to $V_{SS}$. N-channel transistor 32 has a drain connected to the emitter of transistor 27, a gate for receiving voltage $N_{BIAS}$, and a source connected to $V_{SS}$. N-channel transistor 33 has a drain connected to the emitter of transistor 26, a gate for receiving voltage $N_{BIAS}$, and a source connected to $V_{SS}$.

Level converters and output drivers 40 represents conventional circuitry to perform the functions of level converters and output drivers. Level converters and output drivers 40 receive complementary signals $V_I$ and $\overline{V_I}$ from ECL logic gate 30 and includes circuitry to provide complementary output signals A and $\overline{A}$ at TTL or CMOS logic levels depending on which level of output logic is desired.

During normal operation, ECL logic gate 30 receives an ECL logic level input signal, $A_{IN}$, through the base of transistor 21. $A_{IN}$ swings between an ECL logic high voltage of approximately $-0.8$ volts and an ECL logic low voltage of approximately $-1.6$. For typical applications, the recommended $V_{DD}$ is equal to approximately 0 volts and $V_{SS}$ is equal to approximately $-5.2$ volts. Transistors 21 and 29 form an emitter-follower circuit which drops the voltage received at the base of transistor 27 to one diode voltage drop (approximately $-0.8$ volts) below $A_{IN}$. Hence, the voltage at node N100 swings between approximately $-1.6$ volts and $-2.4$ volts. $V_{REF}$ is set at the midpoint of the input signal voltage swing at node N100. For ECL logic levels, $V_{REF}$ is equal to approximately $-2.0$ volts. If the voltage at the base of transistor 27 is more negative than $V_{REF}$, which is the case if $A_{IN}$ is an ECL logic low, then the base-emitter voltage of transistor 27 is too low to support conduction and transistor 27 is essentially off (or non conductive) and transistor 28 is conductive. Transistor 32 receives $N_{BIAS}$ and acts as a constant current source. A current labeled "$I_{32}$", through transistor 32, will be steered through transistor 28 and the voltage at the base of transistor 26 will be equal to $V_{DD}$ minus $I_{32}R_{24}$ where $R_{24}$ is the resistance of resistor 24. The voltage at the base of transistor 25 will be equal to approximately $V_{DD}$. If the voltage at the base of transistor 27 is less negative then $V_{REF}$, which is the case if $A_{IN}$ was an ECL logic high, then transistor 27 will be conductive and transistor 28 will be non conductive. Current $I_{32}$ will be steered through transistor 27 and the voltage at the base of transistor 25 will be equal to $V_{DD}$ minus $I_{32}R_{23}$ where $R_{23}$ is the resistance of resistor 23. The voltage at the base of transistor 26 will be equal to approximately $V_{DD}$.

Transistors 25 and 31 form another emitter-follower circuit where the signal $V_I$ at the emitter of transistor 25 is equal to the voltage at the base of transistor 25 minus one diode voltage drop. Transistors 26 and 33 also form an emitter-follower circuit where the voltage $\overline{V_I}$ at the emitter of transistor 26 is equal to the voltage at the base of transistor 26 minus one diode voltage drop. Signals $V_I$ and $\overline{V_I}$ are received by level converters and output drivers 40, which provide complementary output signals A and $\overline{A}$ at CMOS or TTL logic levels.

In some applications, $A_{IN}$ may be unterminated, in which case $A_{IN}$ is pulled low to $V_{SS}$ through resistor 22. If $A_{IN}$ is pulled low to $V_{SS}$, node N100 will also be pulled low to $V_{SS}$ through transistor 29. The base of transistor 27 will be subjected to a large negative voltage causing transistor 27 to be reverse biased. The amount of the reverse bias in this case is determined by the voltage at node N101. As an example, during testing of an integrated circuit, sometimes called "burn in", $V_{SS}$ may be increased to $-6.5$ volts. If $A_{IN}$ is unterminated, the voltage at node N100 is equal to $-6.5$ volts causing transistor 27 to be reverse biased. The voltage at N101 is equal to $V_{REF}$ minus one diode voltage drop, or $-2.8$ volts. The amount of reverse bias on transistor 27 is equal to approximately $-6.5$ volts minus $-2.8$ volts, or $-3.7$ volts, which is large enough to lead to unacceptable degradation and decreased reliability of transistor 27.

In the prior art circuit of FIG. 1, a large reverse bias of $-3.7$ volts can be better tolerated if transistor 27 is a diffused bipolar transistor, because the relatively light doping densities result in a lower electric field at the base-emitter junction when the transistor is reverse biased. But, polysilicon-emitter bipolar transistors are now used in many applications because they provide approximately the same $\beta$ as diffused junction transistors, are smaller, and can handle higher currents than diffused junction transistors, resulting in faster switching times. But, polysilicon transistors are more susceptible to failure because greater doping densities in the base-emitter junction result in a larger electric field in the base-emitter junction when the transistor is reverse biased.

Figure 2:
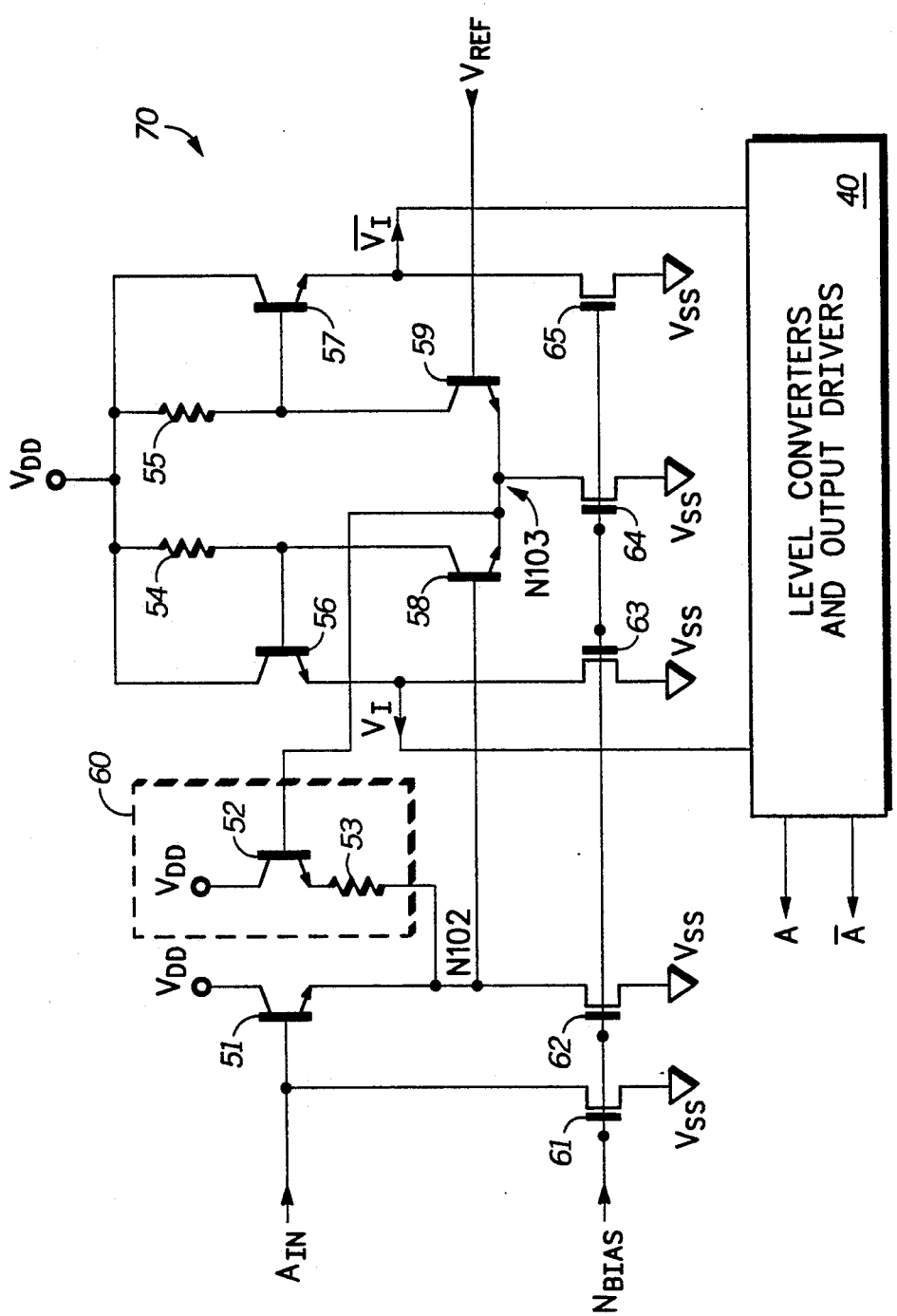
FIG. 2 illustrates in partial schematic form and partial block diagram form an ECL logic gate with a voltage protection clamp incorporated in an ECL address buffer in accordance with the present invention.

FIG. 2 illustrates in partial schematic form and partial block diagram form an ECL logic gate 70 with a voltage protection clamp 60 incorporated in an ECL address buffer 50 in accordance with the present invention. ECL address buffer 50 includes ECL logic gate 70, voltage protection clamp 60, and level converters and output drivers 40. ECL logic gate 70 includes NPN transistors 51, 56, 57, 58, and 59, N-channel transistors 61, 62, 63, 64, and 65, and resistors 54 and 55. Voltage protection clamp 60 includes NPN transistors 52 and resistor 53. NPN transistor 51 has a collector connected to $V_{DD}$, a base for receiving ECL logic level input signal $A_{IN}$, and an emitter. NPN transistor 52 has a collector connected to $V_{DD}$, a base, and an emitter connected to a node labeled "N102". Resistor 53 has a first terminal connected to the emitter of transistor 52 and a second terminal connected to the emitter of transistor 51 at node N102. Resistor 54 has a first terminal connected to $V_{DD}$ and a second terminal. Resistor 55 has a first terminal connected to $V_{DD}$ and a second terminal. NPN transistor 56 has a collector connected to $V_{DD}$, a base connected to the second terminal of resistor 54, and an emitter for providing signal $V_I$. NPN transistor 57 has a collector connected to $V_{DD}$, a base connected to the second terminal of resistor 55, and an emitter for providing signal $\overline{V}_I$. NPN transistor 58 has a collector connected to the second terminal of resistor 54, a base connected to the emitter of transistor 51 at node N102, and an emitter connected to a node labeled "N103". NPN transistor 59 has a collector connected to the second terminal of resistor 55, a base for receiving a reference voltage $V_{REF}$, and an emitter connected to the emitter of transistor 58 at node N103. N-channel transistor 61 has a drain connected to the base of transistor 51, a gate for receiving input voltage $N_{BIAS}$, and a source connected to $V_{SS}$. N-channel transistor 62 has a drain connected to the emitter of transistor 51 at N102, a gate for receiving input voltage $N_{BIAS}$, and a source connected to $V_{SS}$. N-channel transistor 63 has a drain connected to the emitter of transistor 56, a gate for receiving input voltage $N_{BIAS}$, and a source connected to $V_{SS}$. N-channel transistor 64 has a drain connected to the emitter of transistor 58 at node N103, a gate for receiving input voltage $N_{BIAS}$, and a source connected to $V_{SS}$. N-channel transistor 65 has a drain connected to the emitter of transistor 57, a gate for receiving input voltage $N_{BIAS}$, and a source connected to $V_{SS}$.

As illustrated in FIG. 1, level converters and output drivers 40 represents conventional circuitry to perform the functions of level converters and output drivers. Level converters and output drivers 40 receives complementary signals $V_I$ and $\overline{V}_I$ from ECL logic gate 70 and includes TTL or CMOS circuitry to provide complementary output signals A and $\overline{A}$ at TTL or CMOS logic levels depending on which output logic level circuitry is used.

ECL logic gate 70 receives an ECL logic level input signal, $A_{IN}$, through the base of transistor 51. $A_{IN}$ swings between an ECL logic high voltage of approximately −0.8 volts and an ECL logic low voltage of approximately −1.6. In the preferred embodiment, ECL logic gate 70 operates with a value of $V_{SS}$ down to approximately −5.2 volts. Transistors 51 and 62 form an emitter-follower circuit which drops the voltage received at the base of transistor 58 to one $V_{BE}$ (approximately −0.8 volts) below $A_{IN}$. Hence, the voltage at node N102 swings between −1.6 volts and −2.4 volts. $V_{REF}$ is set at the midpoint of the input signal voltage swing at node N102. For ECL logic levels, $V_{REF}$ is equal to approximately −2.0 volts. If the voltage at the base of transistor 58 is more negative than $V_{REF}$, which would be the case if $A_{IN}$ was an ECL logic low, then the base-emitter voltage of transistor 58 is too low to support conduction and transistor 58 is essentially off (or non conductive) and transistor 59 is conductive. Transistor 64 receives $N_{BIAS}$ and acts as a constant current source. A current labeled "$I_{64}$", through transistor 64, will be steered through transistor 59 and the voltage at the base of transistor 57 will be equal to $V_{DD}$ minus $I_{64}R_{55}$ where $R_{55}$ is the resistance of resistor 55. The voltage at the base of transistor 56 will be equal to approximately $V_{DD}$. If the voltage at the base of transistor 58 is less negative then $V_{REF}$, which would be the case if $A_{IN}$ was an ECL logic high, then transistor 58 will be conductive and transistor 59 will be non conductive. Current $I_{64}$ will be steered through transistor 58 and the voltage at the base of transistor 56 will be equal to $V_{DD}$ minus $I_{64}R_{54}$, where $R_{54}$ is the resistance of resistor 54. The voltage at the base of transistor 57 will be equal to approximately $V_{DD}$.

When $A_{IN}$ is a normal ECL level voltage, transistor 52 is reverse biased so that there is essentially no current flow through transistor 52 or resistor 53. But if $A_{IN}$ is a large negative voltage which approaches $V_{SS}$, or if $A_{IN}$ is left floating, voltage protection clamp 60 will control the voltage at N102. The current $I_{64}$ will be steered through transistor 59 and the voltage at N103 will be equal to $V_{REF}$ minus one diode voltage drop, or approximately −2.8 volts. Transistor 52 and resistor 53 will act to pull-up and clamp the voltage at N102 at a value higher than $V_{SS}$, thereby reducing the amount of reverse bias on transistor 58 to more acceptable levels. In the preferred embodiment, the resistance of resistor 53 is set to equally distribute the large reverse bias between transistors 51 and 58.

As an example, if $A_{IN}$ is unterminated, and $V_{SS}$ is at −6.5 volts, N102 will be pulled toward $V_{SS}$ by transistor 62. Transistor 58 will be non conductive and transistor 59 will be conductive, resulting in the voltage at N103 being equal to $V_{REF}$ minus one diode voltage drop, or −2.8 volts. Transistor 52 receives −2.8 volts at its base. The voltage at the emitter of transistor 52 is equal to −2.8 minus one diode voltage drop or −3.6 volts. Recall that transistor 27 of the prior art circuit of FIG. 1 had a large reverse bias of −3.7 volts if $A_{IN}$ was unterminated and $V_{SS}$ was equal to −6.5 volts. The resistance of resistor 53 is calculated so that the −3.7 volt $V_{BE}$ is distributed between transistors 51 and 58 instead of being dropped across transistor 58 alone. Optimally, the large reverse bias will be distributed equally between transistors 51 and 58. To do that, resistor 53 must drop an additional 1.05 volts so that the voltage at node N102 is equal to approximately −4.65 volts, resulting in the $V_{BE}$ of transistors 51 and 58 both being equal to −1.85 volts.

Transistors 56 and 63 form another emitter-follower circuit where the voltage $V_I$ is equal to the voltage at the base of transistor 56 minus $V_{BE}$. Transistors 57 and 65 also form an emitter-follower circuit where the voltage $\overline{V}_I$ is equal to the voltage at the base of transistor 57 minus $V_{BE}$. Signals $V_I$ and $\overline{V}_I$ are received by level converters and output drivers 40 which provide complementary output signals A and $\overline{A}$ at CMOS or TTL logic levels.

While the invention has been described in the context of a preferred embodiment, it will be apparent to those skilled in the art that the present invention may be modified in numerous ways and may assume many embodiments other than that specifically set out and described above. For example, additional emitter-follower stages may be added to the differential amplifier stage. Also, the ECL logic gate 50 may be used without level converters or output drivers in some applications. A resistor may be substituted for transistor 61, or a CMOS current mirror may be substituted for resistors 54 and 55. In addition, $V_{DD}$ may be a positive voltage while $V_{SS}$ is connected to ground. Accordingly, it is intended by the appended claims to cover all modifications of the invention which fall within the true spirit and scope of the invention.

We claim:

1. An ECL logic gate with voltage protection, comprising:
   an input stage including a first emitter-follower bipolar transistor having a base for receiving an input signal, and an emitter for providing a first signal;
   a differential amplifier stage including second and third bipolar transistors having bases for respectively receiving said first signal and a reference voltage and having emitters coupled together, collectors of said second and third transistors respectively providing second and third signals; and means coupled between said emitters of said second and third bipolar transistors and said emitter of said first emitter-follower transistor, for providing a voltage at said emitter of said first emitter-follower bipolar transistor substantially half of a voltage difference between said input signal and a voltage at said emitters of said second and third bipolar transistors when said input signal reverse biases said first emitter follower bipolar transistor and said second bipolar transistor.

2. An ECL logic gate with voltage protection as recited in claim 1, further comprising:

a first output stage including a second emitter-follower bipolar transistor having a base coupled to said collector of said second transistor, for receiving said second signal and having an emitter for providing a fourth signal; and a second output stage including a third emitter-follower bipolar transistor having a base coupled to said collector of said third transistor, for receiving said third signal and having an emitter for providing a fifth signal.

3. An ECL logic gate with voltage protection as recited in claim 2, wherein said fourth and fifth signals are complementary intermediate logic signals.

4. An ECL logic gate with voltage protection as recited in claim 3, further comprising level converter means for receiving said fourth and fifth intermediate logic signals and for providing corresponding complementary output signals at TTL or CMOS logic levels.

5. An ECL logic gate as recited in claim 1, wherein said voltage protection clamp means comprises:

an NPN transistor having a base connected to the coupled emitters of said differential amplifier stage, a collector connected to a positive power supply voltage terminal, and an emitter; and a resistor having a first terminal connected to said emitter of said NPN transistor and a second terminal connected to the emitter of said first emitter-follower transistor.

6. An ECL logic gate with voltage protection as recited in claim 1, wherein said input stage further includes a current source for providing a predetermined current from said emitter of said first emitter-follower transistor.

7. An ECL logic gate with voltage protection as recited in claim 1, wherein said collectors of said second and third bipolar transistors are resistively coupled to a power supply voltage terminal.

8. An ECL logic gate with voltage protection as recited in claim 1, wherein said differential amplifier stage further includes a current source coupled to said emitters of said second and third bipolar transistors for conducting a predetermined current therefrom.

9. An ECL logic gate with voltage protection as recited in claim 1, wherein said first emitter-follower transistor and said second bipolar transistor have polysilicon emitters.

10. An ECL logic gate with voltage protection, comprising:

a first transistor having a first current electrode coupled to a first power supply voltage terminal, a control electrode for receiving a control signal, and a second current electrode;

a second transistor having a first current electrode coupled to said first power supply voltage terminal, a control electrode, and a second current electrode;

a first resistor having a first terminal coupled to said second current electrode of said second transistor and a second terminal coupled to said second current electrode of said first transistor;

a third transistor having a first current electrode coupled to said control electrode of said first transistor, a control electrode for receiving a control voltage, and a second current electrode coupled to a second power supply voltage;

a fourth transistor having a first current electrode coupled to said second current electrode of said first transistor, a control electrode for receiving said control voltage, and a second current electrode coupled to said second power supply voltage terminal;

a second resistor having a first terminal coupled to said first power supply voltage terminal and a second terminal;

a third resistor having a first terminal coupled to said first power supply voltage terminal and a second terminal;

a fifth bipolar transistor having a collector connected to said second terminal of said second resistor, a base connected to said second terminal of said first resistor, and an emitter coupled to said control electrode of said second transistor;

an sixth bipolar transistor having a collector connected to said second terminal of said third resistor, a base for receiving a reference voltage, and an emitter connected to said emitter of said fifth transistor; and a seventh transistor having a first current electrode coupled to said emitter of said fifth transistor, a control electrode for receiving said control voltage, and a second current electrode coupled to said second power supply voltage terminal.

11. An ECL logic gate as recited in claim 10, further comprising:

an eighth transistor having a first current electrode coupled to said first power supply voltage terminal, a control electrode coupled to said collector said fifth transistor, and a second current electrode for providing a first intermediate signal;

a ninth transistor having a first current electrode coupled to said second current electrode of said eighth transistor, a control electrode for receiving said control voltage, and a second current electrode coupled to said second power supply voltage terminal;

a tenth transistor having a first current electrode coupled to said first power supply voltage terminal, a control electrode coupled to said collector of said sixth transistor, and a second current electrode for providing a second intermediate signal; and an eleventh transistor having a first current electrode coupled to said second current electrode of said tenth transistor, a control electrode for receiving said control signal, and a second current electrode coupled to said second power supply voltage terminal.

12. An ECL logic gate with voltage protection as recited in claim 11, further comprising level converter means for receiving said first and second intermediate signals and for providing corresponding complementary output signals.

13. An ECL logic gate with voltage protection as recited in claim 11, wherein at least one of said first, second, fifth, sixth, eighth, and tenth transistors are bipolar transistors.

14. An ECL logic gate with voltage protection as recited in claim 11, wherein at least one of said third, fourth, seventh, ninth, and eleventh transistors are N-channel MOSFET transistors.

15. An ECL logic gate with voltage protection as recited in claim 11, wherein said first and second intermediate signals are complementary intermediate logic signals.

16. An ECL logic gate with voltage protection, comprising:
an input stage including a first emitter-follower bipolar transistor having a base for receiving an input signal, and an emitter for providing a first signal;
a differential amplifier stage including second and third bipolar transistors having bases for respectively receiving said first signal and a reference voltage and having emitters coupled together, collectors of said second and third transistors respectively providing second and third signals;
a voltage protection clamp including an NPN transistor having a base connected to the coupled emitters of said differential amplifier stage, a collector connected to a positive power supply voltage terminal, and an emitter, and a resistor having a first terminal connected to said emitter of said NPN transistor and a second terminal connected to the emitter of said first emitter-follower transistor, for providing a voltage at said emitter of said first emitter-follower bipolar transistor substantially half of a voltage difference between said input signal and a voltage at said emitters of said second and third bipolar transistors when said input signal reverse biases said first emitter follower bipolar transistor and said second bipolar transistor;
a first output stage including a second emitter-follower bipolar transistor having a base coupled to said collector of said second transistor, for receiving said second signal and having an emitter for providing a fourth signal; and
a second output stage including a third emitter-follower bipolar transistor having a base coupled to said collector of said third transistor, for receiving said third signal and having an emitter for providing a fifth signal.

17. An ECL logic gate with voltage protection as recited in claim 16, wherein said fifth signal is the complement of said fourth signal.

18. An ECL logic gate with voltage protection as recited in claim 16, further comprising level converter means for receiving said fourth and fifth signals and for providing corresponding complementary output signals at TTL or CMOS levels.

19. An ECL logic gate with voltage protection as recited in claim 16, wherein said input stage further includes a current source for providing a predetermined current from said emitter of said first emitter-follower transistor.

20. An ECL logic gate with voltage protection as recited in claim 16, wherein said first emitter-follower transistor and said second bipolar transistor have polysilicon emitters.

* * * * *